(12) United States Patent
Lo et al.

(10) Patent No.: US 8,291,298 B2
(45) Date of Patent: Oct. 16, 2012

(54) ANALOG ITERATIVE DECODER WITH EARLY-TERMINATION

(75) Inventors: Ming Yam Lo, Hong Kong (CN); Wai Ho Mow, Hong Kong (CN); Wing Hung Ki, Hong Kong (CN)

(73) Assignee: Yim Tu Investments Ltd., LLC, Wilmington, DE (US)

( * ) Notice: Subject to any disclaimer, the term of this patent is extended or adjusted under 35 U.S.C. 154(b) by 711 days.

(21) Appl. No.: 12/431,917

(22) Filed: Apr. 29, 2009

(65) Prior Publication Data

US 2010/0281337 A1 Nov. 4, 2010

(51) Int. Cl.
*G06F 11/00* (2006.01)
(52) U.S. Cl. ...................................... 714/774
(58) Field of Classification Search .................. 714/774, 714/758
See application file for complete search history.

(56) References Cited

U.S. PATENT DOCUMENTS

| | | | | |
|---|---|---|---|---|
| 7,266,750 | B1 * | 9/2007 | Patapoutian et al. | 714/758 |
| 7,600,180 | B2 * | 10/2009 | Shen et al. | 714/801 |
| 7,793,201 | B1 * | 9/2010 | Ulriksson | 714/794 |
| 8,171,367 | B2 * | 5/2012 | Gao et al. | 714/752 |
| 2007/0198895 | A1 * | 8/2007 | Paumier et al. | 714/774 |

OTHER PUBLICATIONS

Cai et al. "An Efficient Early Stopping Scheme for LDCP Decoding Based on Check-Node Messages", an IEEE 2008 publication).*
Hemati et al. "A 0.18 μm CMOS Analog Min-Sum iterative Analog Decoder for a . . . LDPC code", an IEEE 2006 publication).*
Loeliger, et al. "Decoding in Analog VLSI," IEEE Communications Magazine, pp. 99-101, Apr. 1999.
Gaudet, et al. "A 13.3-Mb/s 0.35um CMOS analog turbo decoder IC with a configurable interleaver," 2003 IEEE International Solid-State Circuits Conference, 0-7803-7707-9/03, 11 pages, Feb. 11, 2003.
Winstead, et al. "CMOS analog MAP decoder for (8, 4) Hamming code," IEEE Journal of Solid-State Circuits, vol. 39, No. 1, pp. 122-131, Jan. 2004.
Moerz, et al. "An analog 0.25um BiCMOS tailbiting MAP decoder," in Proc. IEEE Solid-States Circuits Conference, pp. 356-357, San Francisco, USA, Feb. 2000.
Hemati, et al. "Iterative decoding in analog CMOS," in Proc. 13th ACM Great Lakes Symposium on VLSI (ACM GLSVLSI), Washington D.C., USA, pp. 15-20, 2003.
Hemati, et al. "Dynamics and Performance Analysis of Analog Iterative Decoding for Low-Density Parity-Check (LDPC) Codes," IEEE Trans. on Communications, vol. 54, No. 1, pp. 61-70, Jan. 2006.
Cui, et al. "An Efficient Early Stopping Scheme for LDPC Decoding," 13th NASA Symposium on VLSI Design, Idaho, USA, Jun. 5-6, 2007.

(Continued)

*Primary Examiner* — Scott Baderman
*Assistant Examiner* — Yair Leibovich
(74) *Attorney, Agent, or Firm* — Turocy & Watson, LLP

(57) ABSTRACT

An iterative decoder comprising a transconductance amplifier, a sampler, a Min-Sum decoder, and an early determination module is provided. The transconductance amplifier outputs a current proportional to the voltage of the coded bit stream. The sampler converts the amplified current into a plurality of currents and stores the sampled currents in a plurality of buffers. The Min-Sum decoder receives parallel currents, wherein currents represent the message of each variable node. The Min-Sum decoder exchanges the message of variable nodes and check nodes iteratively and outputs a set of decode codewords according to the possibilities. The early terminating module stops the iterative decoding when the decoded codeword converged.

24 Claims, 15 Drawing Sheets

OTHER PUBLICATIONS

Hemati, et al, "A Current-mode Maximum Winner-take-all Circuit with Low Voltage Requirement for Min-sum Analog Iterative Decoders," IEEE International Conference on Electronics, Circuits and Systems, vol. 1, pp. 4-7, Dec. 2003.

Carrillo, et al. "Constant-gm Constant-Slew-Rate High-Bandwidth Low-Voltage Rail-to-Rail CMOS Input Stage for VLSI Cell Libraries," IEEE Journal of Solid-State Circuits, vol. 38, No. 8, pp. 1364-1372, Aug. 2003.

Redman-White, W. "A High Bandwidth Constant-gm and Slew-rate Rail-to-rail CMOS Input Circuit and its Application to Analog Cells for Low Voltage VLSI Systems," IEEE Journal of Solid-State Circuits, vol. 32, No. 5, pp. 701-712, May 1997.

Sakurai, et al. "Robust Design of Rail-to-rail CMOS Operational Amplifiers for a Low Power Supply Voltage," IEEE Journal of Solid-State Circuits, vol. 31, No. 2, pp. 146-156, Feb. 1996.

Yan, et al. "Constant-gm Techniques for Rail-to-Rail CMOS Input Stages: A Comparative Study," IEEE Inter. Symp. on Circuits and Systems 2005, pp. 2571-2574, May 2005.

Sugimoto, Y. "A Realization of a Below-1-V Operational and 30-MS/s Sample-and-Hold IC With a 56-dB Signal-to-Noise Ratio by Applying the Current-Based Circuit Approach," IEEE Trans. on Circuits and Systems, vol. 51, No. 1, pp. 110-117, Jan. 2004.

Lee, S. "A Low-Voltage and Low-Power Adaptive Switched-Current Sigma-Delta ADC for Bio-Acquisition Microsystems," IEEE Trans. on Circuits and Systems, vol. 53, No. 12, pp. 2628-2636, Dec. 2006.

Wang, et al. "Design and Implementation of a Switched-Current Memory Cell for Low-Power and Weak-Current Operations," IEEE Journal of Solid-State Circuits, vol. 36, No. 2, pp. 304-307, Feb. 2001.

* cited by examiner

16
ANALOG ITERATIVE DECODER WITH EARLY-TERMINATION

TECHNICAL FIELD

The subject innovation relates generally to data communications, and more particularly to error correction in data communications.

BACKGROUND

When a set of digital bits is transmitted from one device to another, noise in the channel may corrupt the bits and produce wrong bits to the receiving end. A coding process is thus needed to recover the wrong information. A certain number of extra bits, called parity bits, are added to the original bits by an encoder at the transmission end. The resulting new messages are called codeword. A decoder at the receiving end does the opposite, receiving the corrupted codeword and trying to recover the correct message bits based on what is received. This process of message recovery is called error-correction.

Different schemes have been proposed to set the constraints in the encoder/decoder pair in order to provide the highest possible success rate of error-correction. The set of constraints, usually represented by a parity check matrix, is called error-correction code (ECC). Low-Density-Parity-Check (LDPC) codes are a type of ECC that performs close to the theoretical limit.

A LDPC decoder uses iterative decoding algorithm, which is usually described by graph representations of the codes. The execution of the algorithm can be described as performing certain computations at the nodes of the graph and passing real messages along the edges, in both directions and iteratively. Iterative decoders have traditionally been implemented by digital circuits, however, research on analog decoding is getting attention because analog decoding consumes less power.

In analog implementations, each node in the graph acts as a computational module which communicates asynchronously with other nodes of the graph through edges. Iterations are thus eliminated and are replaced by the setting behavior of the system. Since the messages in the decoder are allowed to react with each other in a feedback asynchronous manner and do not have to wait for all messages to settle before the next decoding iteration can be started, the asynchronous iterative decoding has the advantage that its overall settling time is shorter relative to its discrete-time counterpart.

The architecture of an analog continuous-time iterative decoder for LDPC codes using the min-sum (MS) algorithm suitable for conventional CMOS circuit implementation has been proposed. See S. Hemati, A. H. Banihashemi, and C. Plett, "*A 0.18-um CMOS Analog Min-Sum Iterative Decoder for a (32, 8) Low-Density Parity-Check (LDPC) Code*," IEEE Journal of Solid-State Circuits, vol. 41, no. 11, pp. 2531-2540, November 2006. The decoder takes advantage of that MS decoding, featured by the minimum and summation operations and can be implemented easily by current-mode circuits. The system can be represented by a bipartite graph (called the Tanner graph) consisting of two classes of "nodes": the variable nodes and the check nodes, separated by analog switches.

However, Hemati et al. does not provide a suitable interface for the analog input bits, which are usually represented in voltages. Moreover, the decoding time depends on the received codeword. The worst-case decoding time for very noisy received codewords can be a hundred times longer than those that are already correct when received. Thus, the decoding period is primarily determined by the worst-case decoding time for very noisy, but correctable, received codewords. This implies that, for most received codewords, even when the decoding result is acceptable, the iterative decoder still keeps running. A lot of power is wasted while the whole receiving end awaits the final results of the decoder. Hence, it is desirable to put an iterative decoder into a stand-by mode as soon as the decoding process is completed so that decoding time and power consumption can be greatly reduced.

SUMMARY

The following presents a simplified summary of the various embodiments of the subject disclosure in order to provide a basic understanding of some aspects described herein. This summary is not an extensive overview of the disclosed subject matter. It is intended to neither identify key or critical elements of the disclosed subject matter nor delineate the scope of the subject various embodiments of the subject disclosure. Its sole purpose is to present some concepts of the disclosed subject matter in a simplified form as a prelude to the more detailed description that is presented later.

In one aspect of the innovation, an iterative decoder that comprises a transconductance amplifier, a sampler, a Min-Sum decoder, and an early termination module is provided. The transconductance amplifier outputs a current proportional to the voltage of the coded bit stream. The sampler converts the amplified current into a plurality of currents and stores the sampled currents in a plurality of buffers. The Min-Sum decoder receives parallel currents, wherein currents represent the likelihood of received signals. The Min-Sum decoder exchanges the likelihoods of variable nodes and check nodes iteratively and outputs a set of decoded codewords based on their possibilities. The early terminating module stops the iterative decoding when the decoded codeword converges.

In another aspect of the innovation, an iterative decoding method for decoding a coded bit stream is provided. The proposed method begins with outputting a current proportional to the voltage of the coded bit stream. The current is converted from serial to parallel currents, wherein the magnitudes and directions of currents represent the possibilities of variable nodes. The possibilities of variable nodes and check nodes are then iteratively exchanged, and the results of the exchanging possibilities are then decoded. The iterative possibility exchanging may stop when the decoded codeword converges.

DETAILED DESCRIPTION

Figure 1:
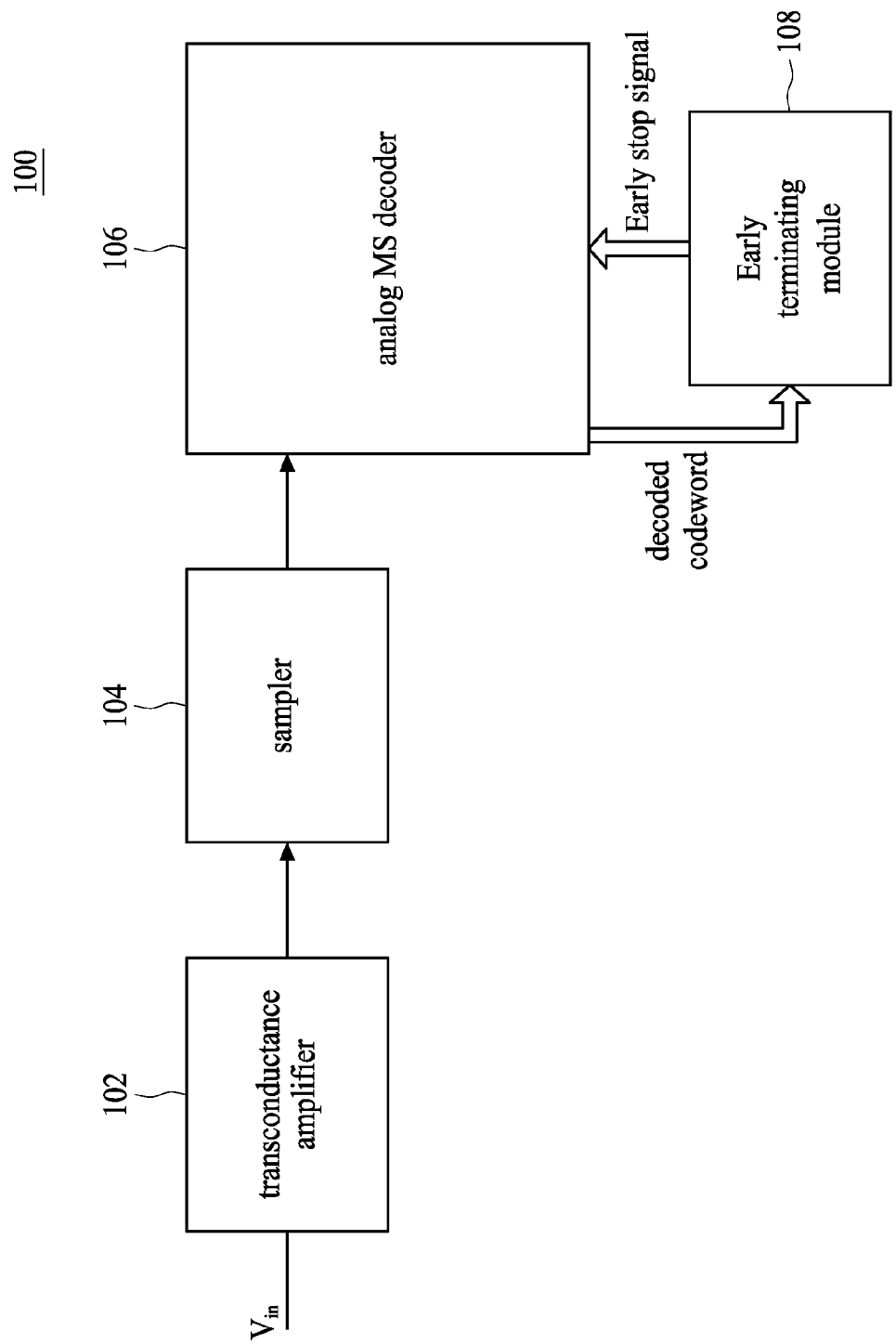
FIG. 1 shows a block diagram of an iterative decoder according to one embodiment of the innovation.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

FIG. 1 shows a block diagram of an iterative decoder 100 according to one embodiment of the innovation. The iterative decoder 100 comprises a transconductance amplifier 102, a sampler 104, an analog MS decoder 106 and an early-terminating module 108. The transconductance amplifier 102, as defined as Voltage Controlled Current Source (VCCS), outputs a current proportional to its input voltage. In some embodiments, a rail-to-rail CMOS constant transconductance amplifier is used, which means the operation range of an input/output voltage always operates from a positive power supply to a negative power supply. The non-linearity of the transconductance amplifier can be achieved by utilizing a feed-forward technique. In embodiments, the transconductance amplifier is operated at 100 MHz for light loads such as 100 pF, or 5.9 MHz for a load capacitor of 15 pF.

The sampler 104 converts the serial analog voltage codeword signals into currents stored in parallel buffers. In some embodiments, a high-speed, low-power switched-current sampler is used. Since the power consumed is increased as the number of codeword bits N increases, low-power is a favored feature. In an embodiment, sampler 104 settles in 1 μs at 1 nA, and is able to settle in less than 10 ns at 1 μA. Messages after the sampler 104 are represented in the form of currents and can be either positive or negative, e.g., polarity of a current can be based on its direction. The analog Min-Sum decoder 106 receives the plurality of sampled currents from the plurality of buffers, wherein each of the sampled currents represents a possibility of a bit being 0 or 1 and iteratively exchanges the possibilities across a plurality variable nodes and check nodes and outputs a set of decoded codewords according to the possibilities. The early terminating module 108 stops the iterative decoding in the analog Min-Sum decoder if the decoded codeword converges. Detailed description about analog Min-Sum decoder 106 and early terminating module 108 are discussed in FIGS. 2-5.

Figure 2:
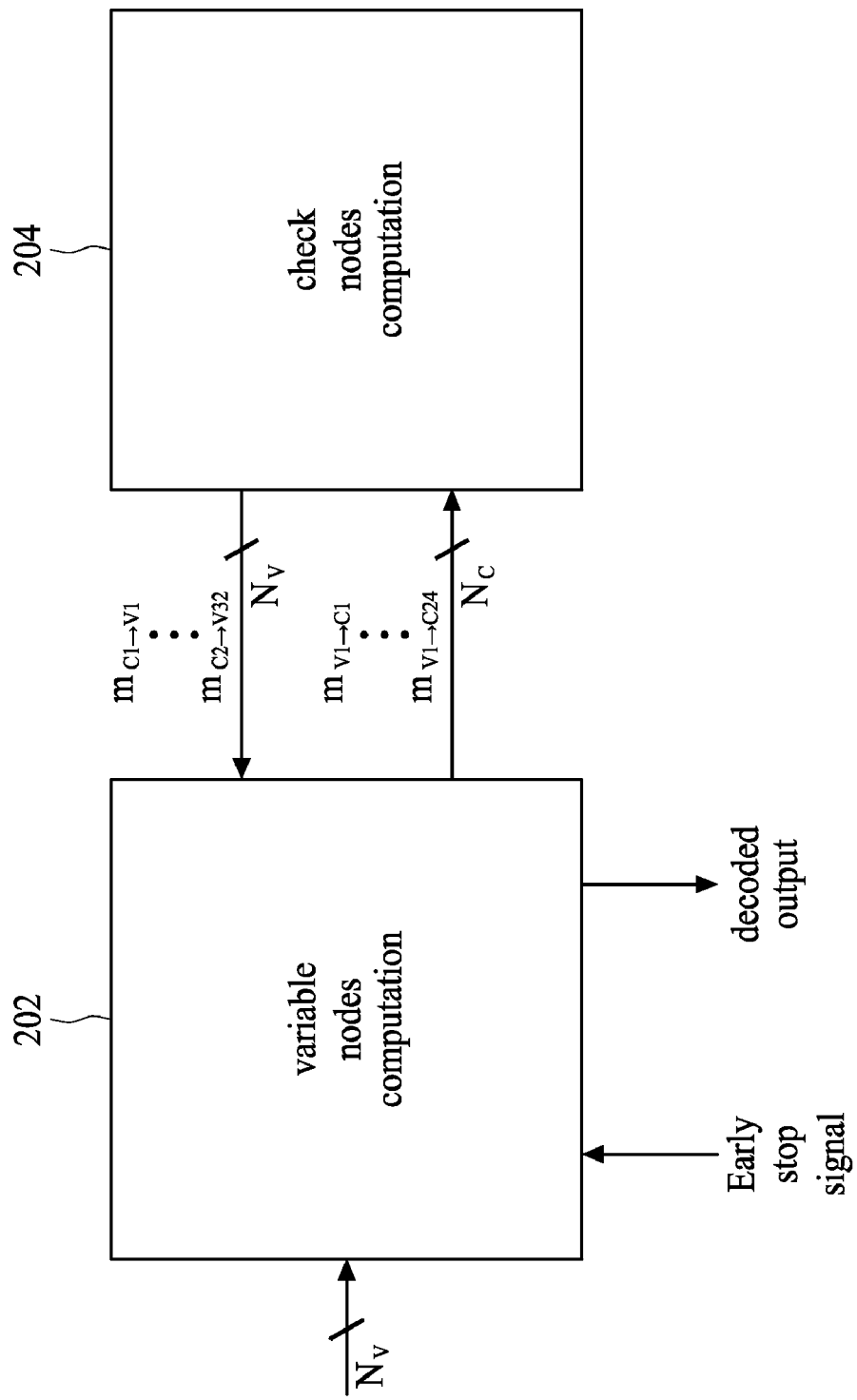
FIG. 2 shows a block diagram of MS decoder according to one embodiment of the innovation.
Figure 3:
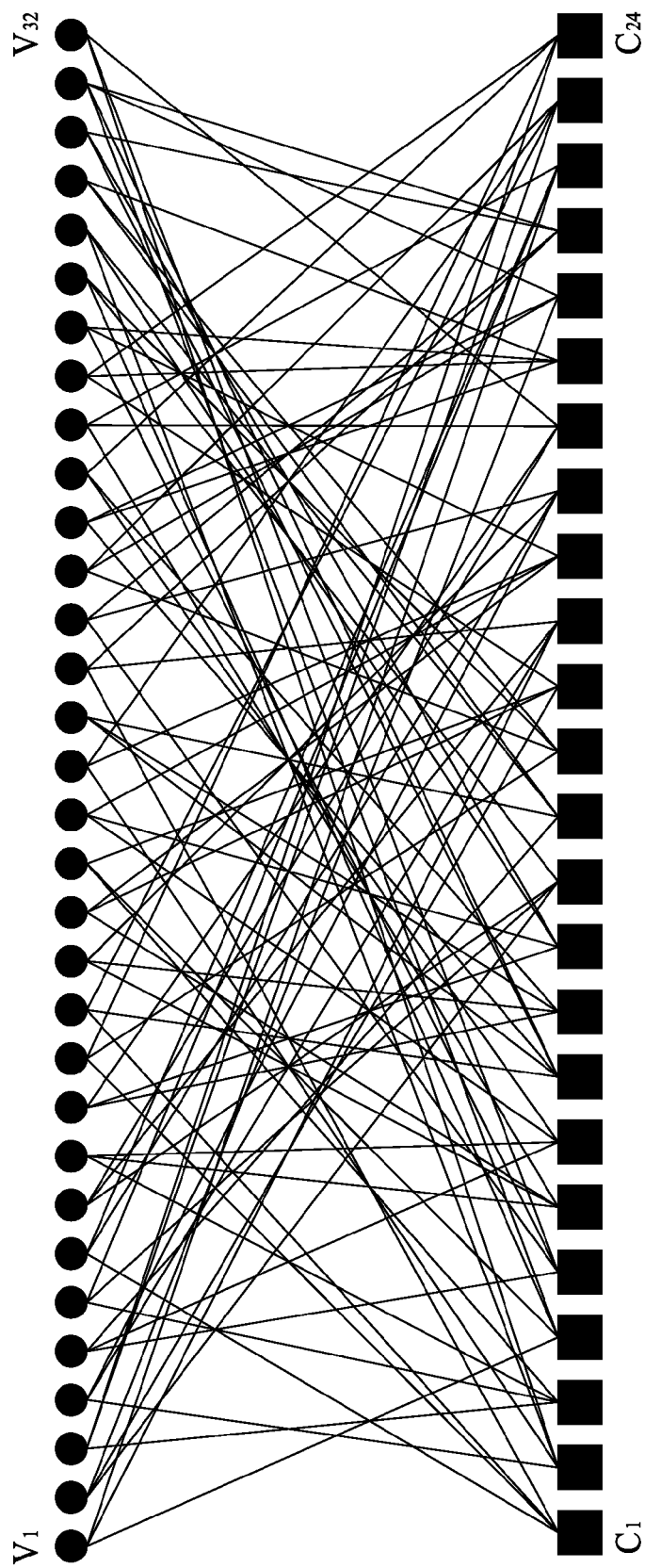
FIG. 3 shows an example Tanner graph representation of a (32,8) LDPC code, where variable nodes and check nodes are shown by circles and squares, respectively.

FIG. 2 shows a block diagram of MS decoder 106 according to one embodiment of the innovation. The MS decoder 106 is initialized based on the received information at the channel output and some statistical information about the channel and information source at the transmitter. Decoding is performed by passing messages through edges of the Tanner graph between the variable nodes and the check nodes, iteratively. FIG. 3 shows an example Tanner graph representation of a (32,8) LDPC code, where variable nodes and check nodes are shown by circles and squares, respectively. At each time instant, a message passed across an edge represents the probability of some part of the graph to be 0 or 1. The iterative nature of these decoding algorithms allows bits that are related through parity equations to exchange their beliefs iteratively in the hope that they finally converge to the most probable transmitted codeword or bits.

The operations in the variable nodes and the check nodes will then be

Variable nodes:

$$M_{v \to c} = \sum_{i \in N(C) \setminus C} M_{i \to v} \bigg| M_v^{(0)}; \text{ and} \tag{1}$$

Check nodes:

$$M_{c \to v} = \prod_{i \in N(C) \setminus v} \text{sgn}(M_{i \to c}) \cdot \min_{i \in N(C) \setminus v} |M_{i \to c}|, \tag{2}$$

where $M_v^{(0)}$ is the initial local message at variable node v (e.g. the initial input), N(.) represents the set of neighboring nodes, and sgn(.) returns 1 or −1 depending on its argument being non-negative or negative, respectively. Equivalently in the circuits, sgn is shown by 0 or Vdd voltages and multiplication of the sgn is implemented by an XOR function. The initial message $M_v^{(0)}$ is computed by replacing the conditional probability density functions of the channel output y corresponding to v in (1). The algorithm then stops if the hard decision assignment of each bit v is a codeword, or a maximum number of iterations are reached.

Figure 4:
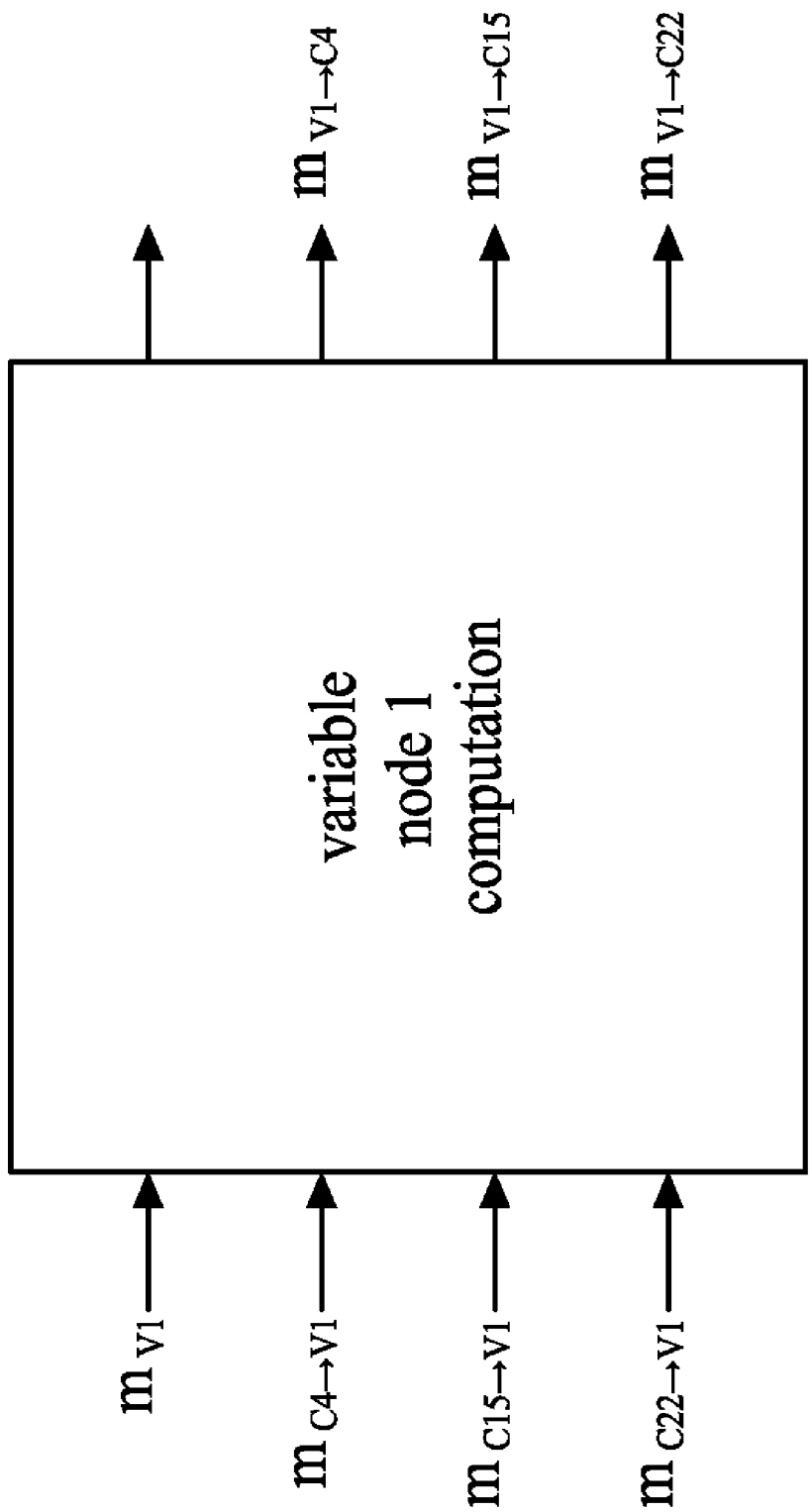
FIG. 4 shows an example computation of a variable node.

FIG. 4 illustrates an example of variable node computation by using the variable node 1 ($V_1$) in FIG. 3 as example. The variable node 1 are based on the following equations that are derived based on (1):

$$\begin{cases} M_{v1} = m_{v1} + m_{c4 \to v1} + m_{c15 \to v1} + m_{c22 \to v1} \\ m_{v1 \to c4} = m_{v1} + m_{c15 \to v1} + m_{c22 \to v1} \\ m_{v1 \to c15} = m_{v1} + m_{c4 \to v1} + m_{c22 \to v1} \\ m_{v1 \to c22} = m_{v1} + m_{c4 \to v1} + m_{c15 \to v1} \end{cases} \tag{3}$$

The other variable node computations can be also derived from equation (1). In sum, the main operation in variable nodes are addition.

Figure 5:
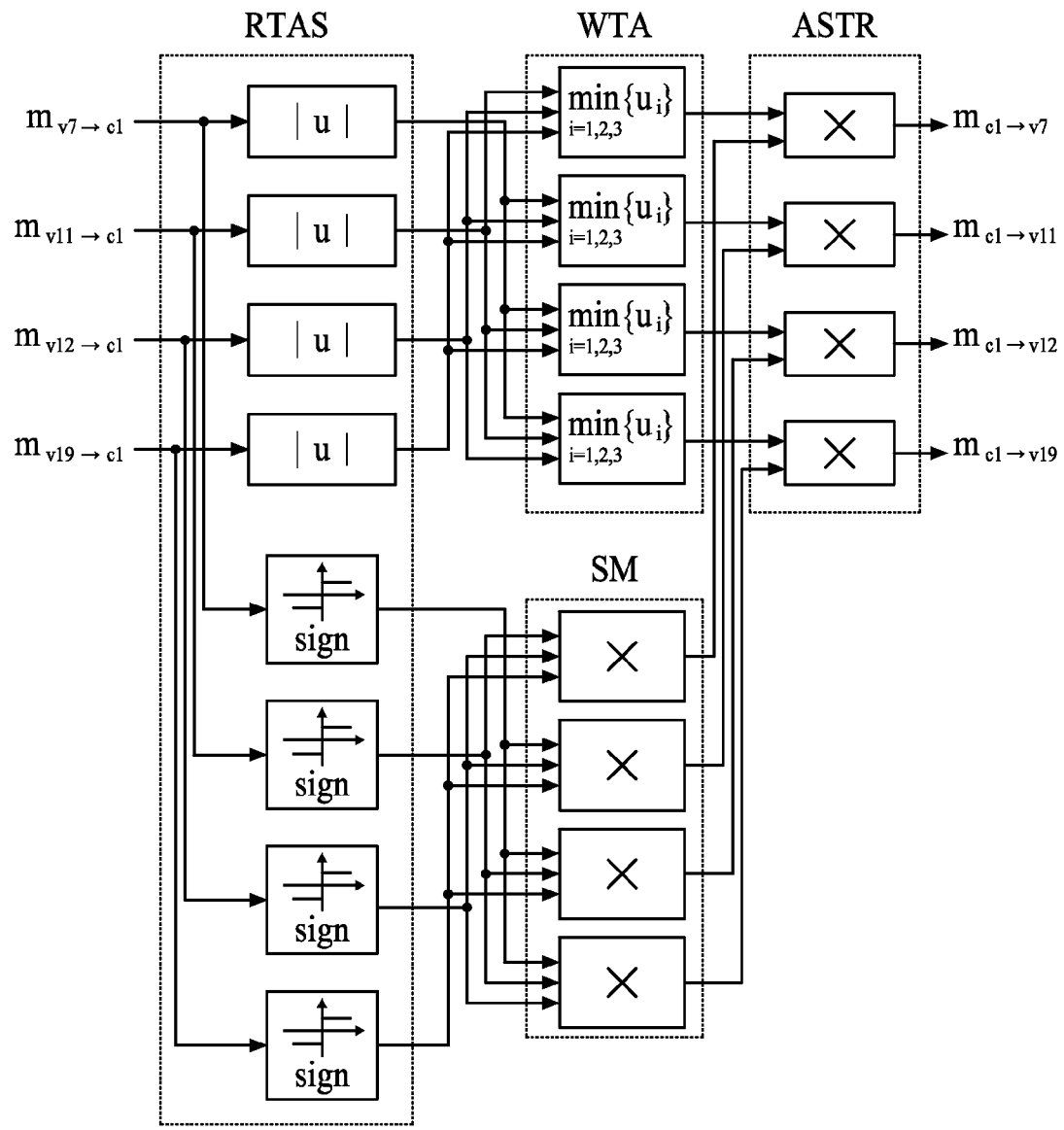
FIG. 5 shows an example implementation of the first check node in FIG. 3 according to one embodiment of the innovation.

FIG. 5 shows an example implementation of the check node No. 1 ($C_1$) in FIG. 3 according to one embodiment of the innovation. The operations in check node No. 1 ($C_1$) are given by the following equations based on (2):

$$\begin{cases} m_{c1 \to v7} = \text{sgn}(m_{v11 \to c1}) \times \text{sgn}(m_{v12 \to c1}) \times \text{sgn}(m_{v19 \to c1}) \times \\ \quad \min(|m_{v11 \to c1}, m_{v12 \to c1}|, m_{v19 \to c1}|) \\ m_{c1 \to v11} = \text{sgn}(m_{v7 \to c1}) \times \text{sgn}(m_{v12 \to c1}) \times \text{sgn}(m_{v19 \to c1}) \times \\ \quad \min(|m_{v7 \to c1}, m_{v12 \to c1}|, m_{v19 \to c1}|) \\ m_{c1 \to v12} = \text{sgn}(m_{v11 \to c1}) \times \text{sgn}(m_{v7 \to c1}) \times \text{sgn}(m_{v19 \to c1}) \times \\ \quad \min(|m_{v11 \to c1}, m_{v7 \to c1}|, m_{v19 \to c1}|) \\ m_{c1 \to v19} = \text{sgn}(m_{v11 \to c1}) \times \text{sgn}(m_{v12 \to c1}) \times \text{sgn}(m_{v7 \to c1}) \times \\ \quad \min(|m_{v11 \to c1}, m_{v12 \to c1}|, m_{v7 \to c1}|) \end{cases}$$

FIG. 5 shows the modules for implementing this node. First, sign and magnitude of all incoming messages are extracted in RTAS (real to absolute value and sign converter)

modules. Then, the magnitude of each outgoing message to each variable node is computed by finding the minimum value among the magnitudes of all the received messages from other variable nodes that are connected to the check node. This operation is performed in the minimum winner-take-all (WTA) modules. The sign of the outgoing message to each variable node is obtained in the sign-multiplier (SM) modules by multiplying the signs of the messages that have been received from other variable nodes. In embodiments of the innovation, an XOR is utilized instead of a multiplayer. Finally, four ASTR (absolute value and sign to real converter) modules combine the sign bits and absolute values and generate the outgoing messages.

Early terminating module 108 stops the MS algorithm decoder 106 if the decoded codeword of the product code decoder 106 is converged. The word "converged" herein is defined as a state that indicates a high level of confidence that the decoded bits represent the bits that were transmitted. The state of convergence, whether converged or not converged, can be determined by one or more criteria. In some embodiments, the convergence measurements are made based on using an error-checking scheme such as Cyclic Redundancy Check (CRC) or by signs of the extrinsic information. Alternatively, the early terminating module 108 stops the product code decoder 106 when decoded output reaches a minimal performance requirement. In some embodiments of the innovation, the WTA threshold detection circuit output can be used to trigger an asynchronous CRC circuit so that the decoding process is stopped early only if both the threshold detection and the CRC criteria are fulfilled. Generally speaking, any early-stopping schemes and their combinations that can be realized as an asynchronous circuit can be used in the proposed continuous-time iterative decoder architecture to reduce power consumption.

Figure 6:
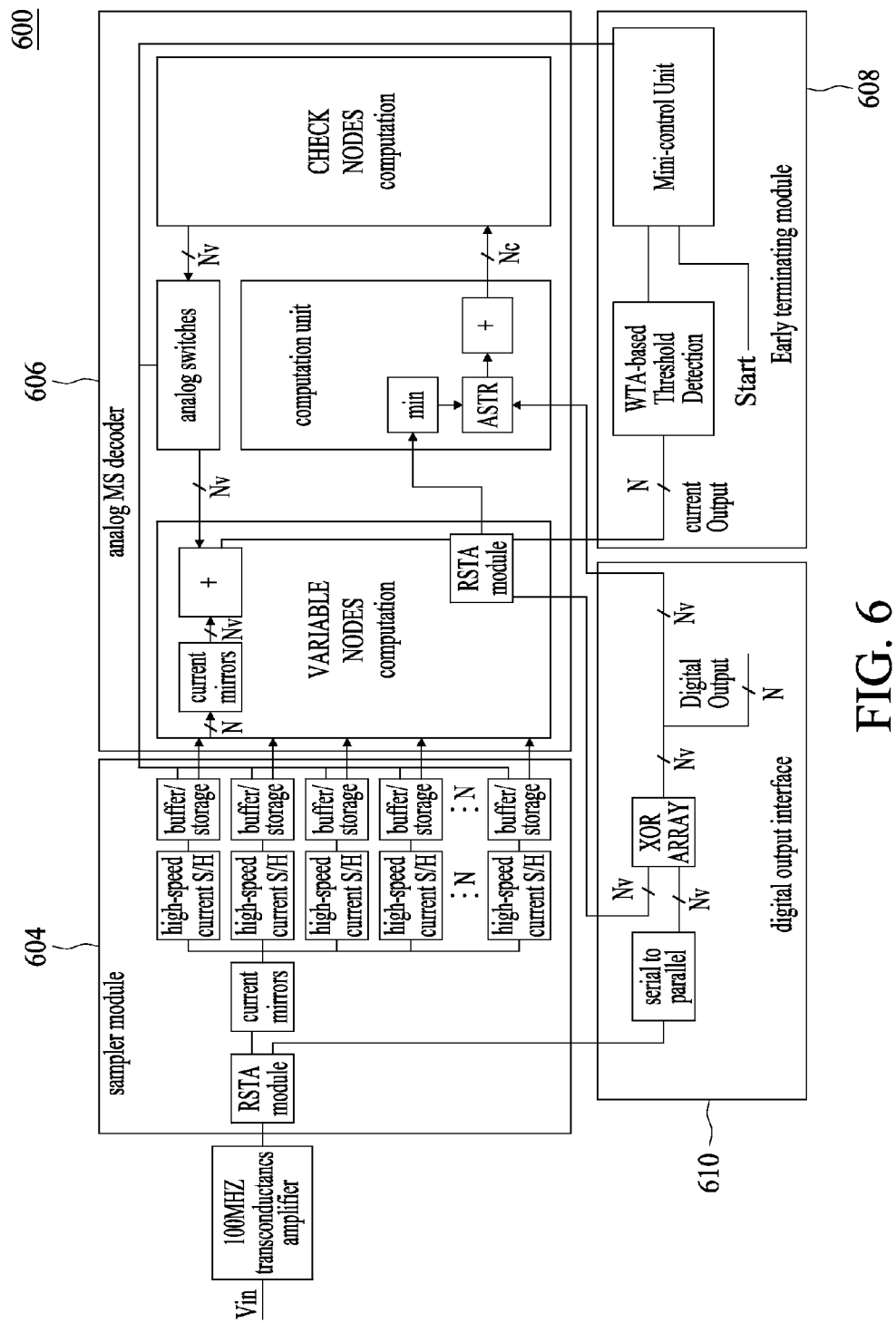
FIG. 6 shows another block diagram of an iterative decoder according to one embodiment of the innovation.
Figure 7:
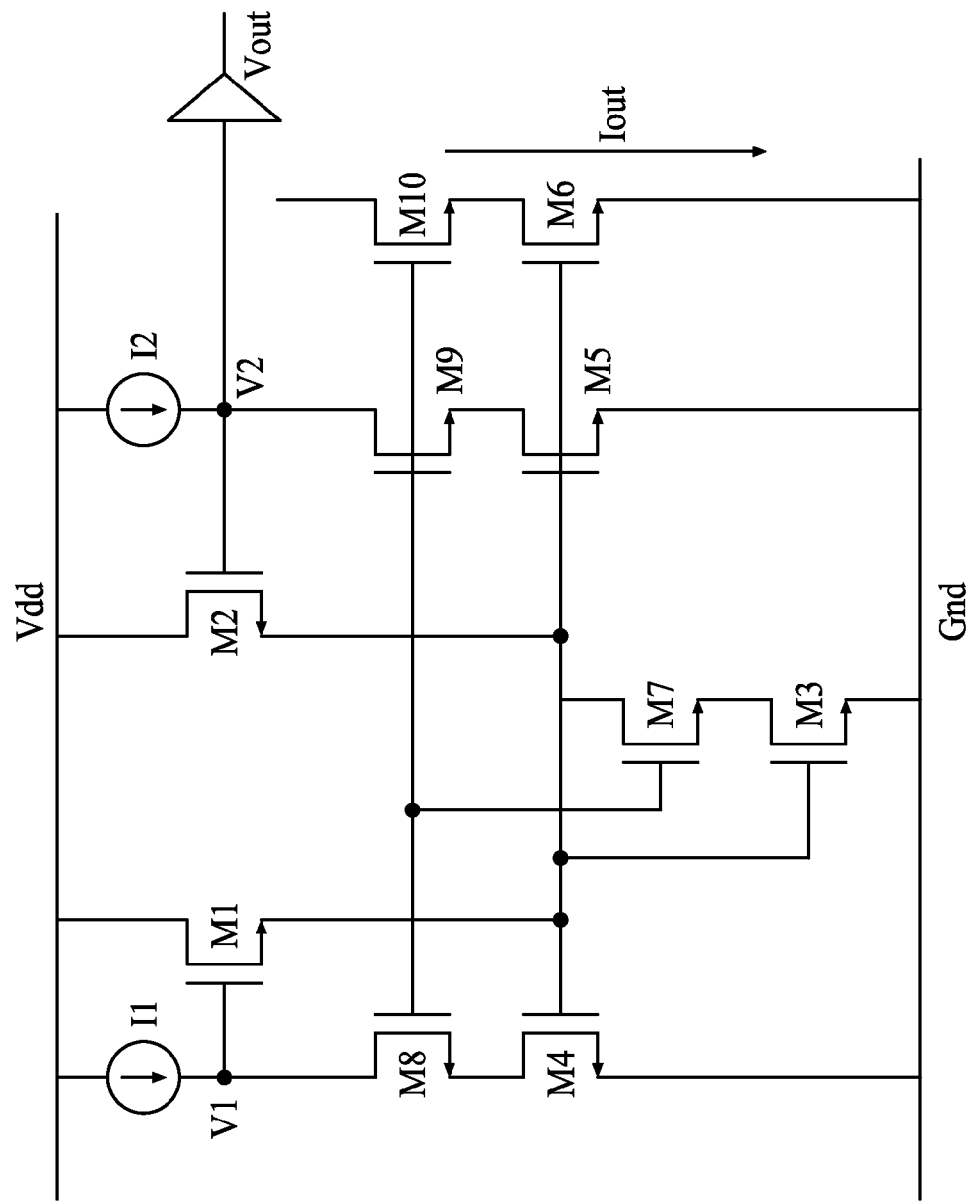
FIG. 7 shows an example of winner-take-all (WTA) based threshold detection circuit.

FIG. 6 shows an iterative decoder 600 according to one embodiment of the innovation. First, a high-speed linear rail-to-rail transconductance 602 is used. The transconductance 602 uses feed-forward technique to compensate the non-linearity, and the transconductance 602 can be as fast as 100 MHz for light loads such as 100 fF (5.9 MHz for load capacitor of 15 pF). A sampler module 604 is required to convert the serial analog voltage codeword signals into currents stored in parallel buffers. A serious of high-speed, low-power switched-current sample- and hold (S/H) circuits are also required. Each sample-and-hold circuit is designed for memory cells with low currents at 1 nA range, but it can also be used in higher current levels at 1 μA range. It settles in 1 μs at 1 nA, and hence will be able to settle in less than 10 ns at 1 μA. The accuracy is not as high, but power is low and speed is high. The high error and noise tolerance of analog MS decoders 606 due to iterative nature of the decoding further favors this sample-and-hold circuit. The structure of an analog MS decoder 606 is a continuous-time iterative decoder for LDPC codes using the MS algorithm suitable for conventional CMOS circuit implementation. Since the analog MS decoder 606 takes advantage of MS decoding, featured by the minimum and summation operations, the analog MS decoder 606 can be implemented easily by current-mode circuits. At an initializing stage, the analog MS decoder 606 takes in an N-bit codeword in current-mode representation, and performs initialization to the variable nodes. When the operation starts, the analog switches are turned on, and the variable and check nodes interact with each other to achieve a stable state. When the stable state is reached, the output currents of the corresponding message bits can be derived from the variable nodes. Digital output interface 610 is optional. If digital output interface 610 exists, the digital message bits, which are the output bits of the decoder, are derived once the stable state is reached. The early terminating module 608 is coupled to the analog MS decoder. An example of WTA-based threshold detection circuit is shown as FIG. 7. The two currents upon comparison are I1, the threshold current, and I2, the output current from the decoder. When I1 is higher than I2, V1 is higher than V2, and the current in M1 is higher than that in M2. Both currents flow to transistor M3, increasing its current until it is equal to I1, when transistors M3 and M4 become a current minor pair. M5 then works in linear region, and M2 is cut off. M6 acts as another current mirror to copy the current in M3. M7 to M10 serve as cascode transistors to improve mirroring accuracy. After the circuit settles, V1 is close to logic 1 and V2 is close to logic 0. A buffer connected to either V1 or V2 will provide the digital output. In this circuit, Vout is 0 when I1>I2.

Figure 8A:
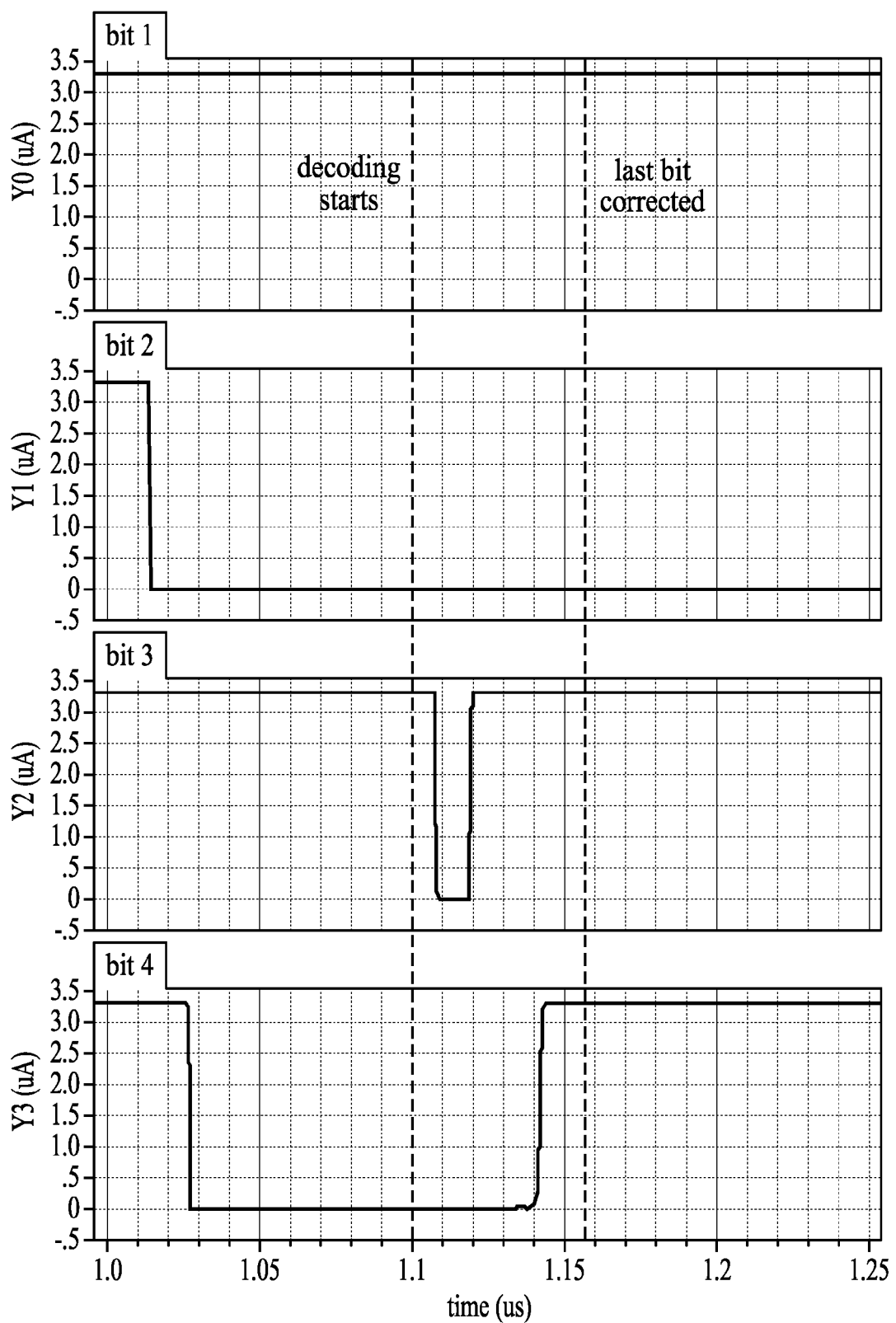
FIGS. 8A-8B show an example of received codeword that requires 4 iterations to decode.
Figure 8B:
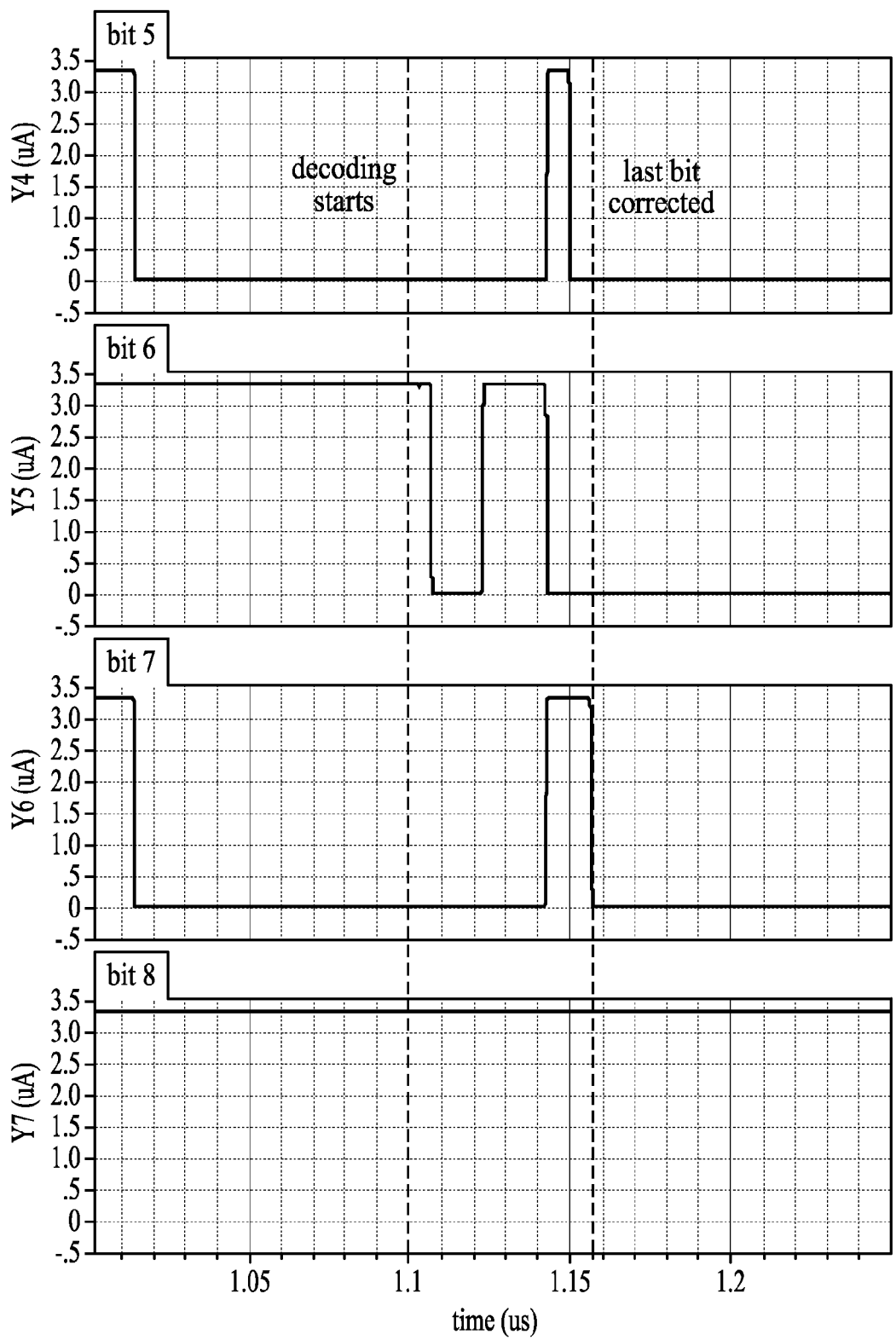
Figure 8C:
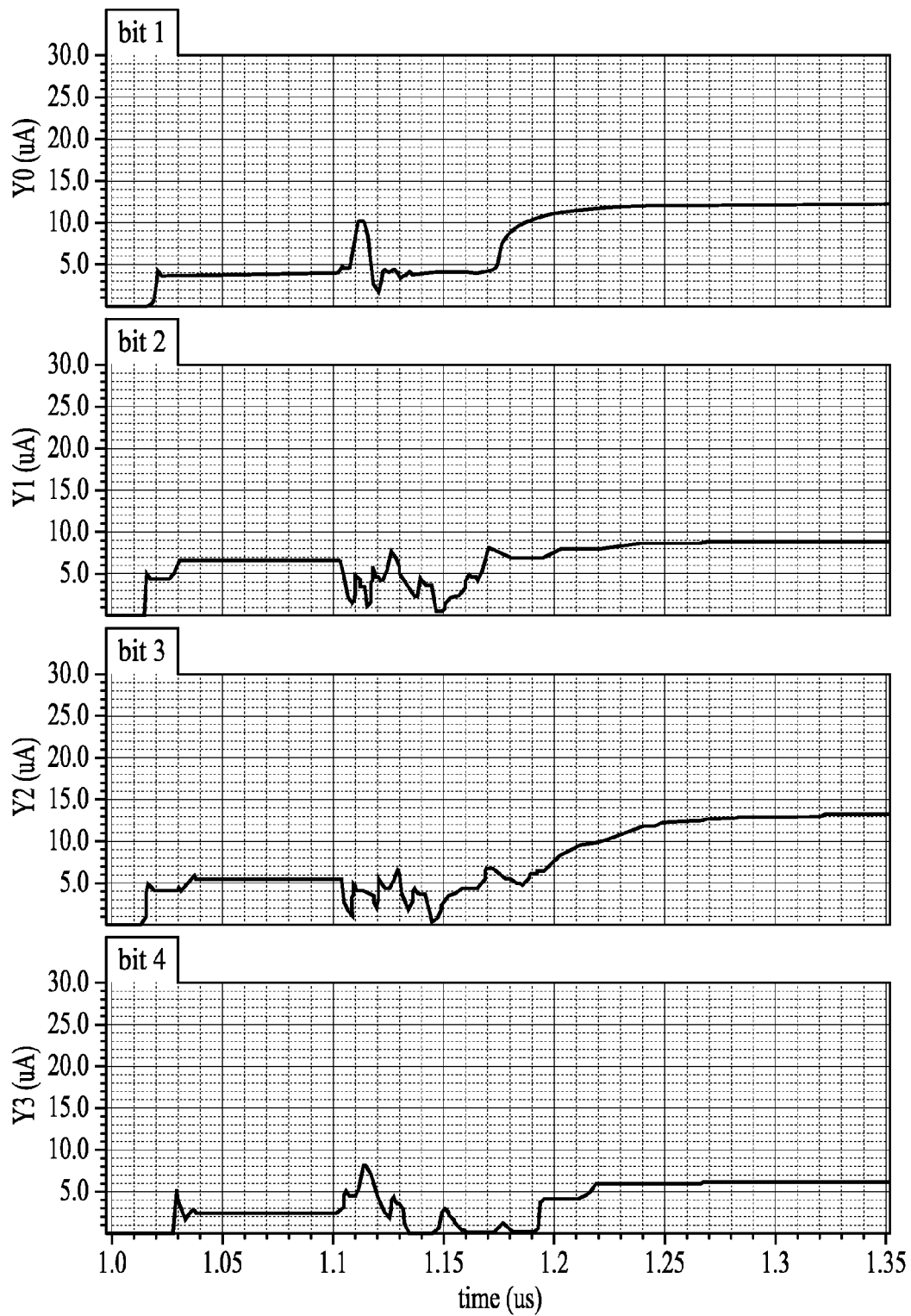
FIGS. 8C-8D show the simulation results when decoding the same codeword in the analog iterative decoder.
Figure 8D:
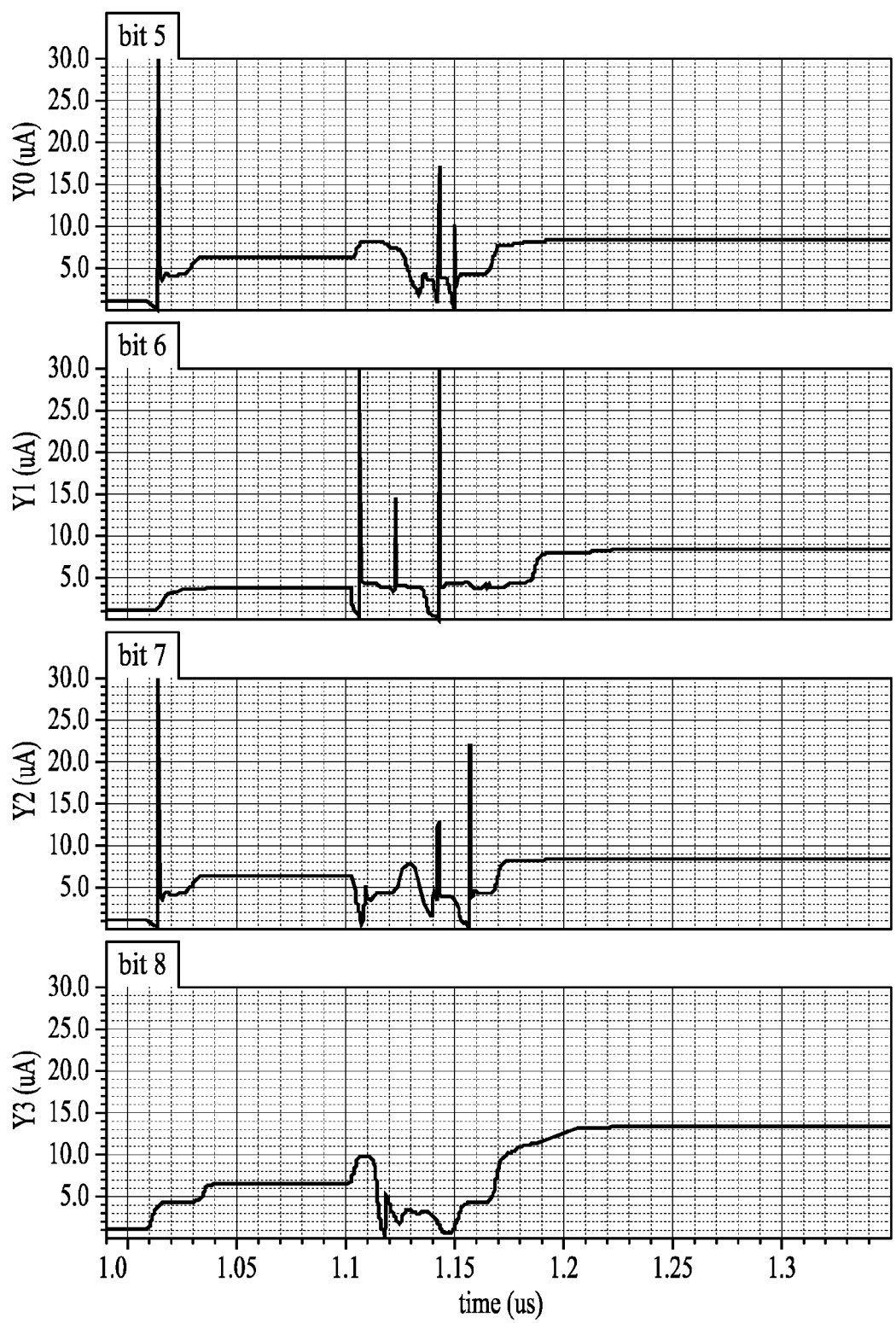

FIGS. 8A-8B shows an example of codeword [1 0 1 1 0 0 0 1] that employs a digital decoder to perform 4 decoding iterations. FIGS. 8C-8D shows the simulation results when decoding the same codeword in the analog iterative decoder. FIG. 8B shows that after the decoding process, all currents, with different directions, are saturated at 6 μA. It is expected that saturated current is smaller in circuit implementation due to the switching current of analog switches after the early-stop signal, delay time required for all signals to reach the threshold, and various circuit non-idealities.

Figure 9:
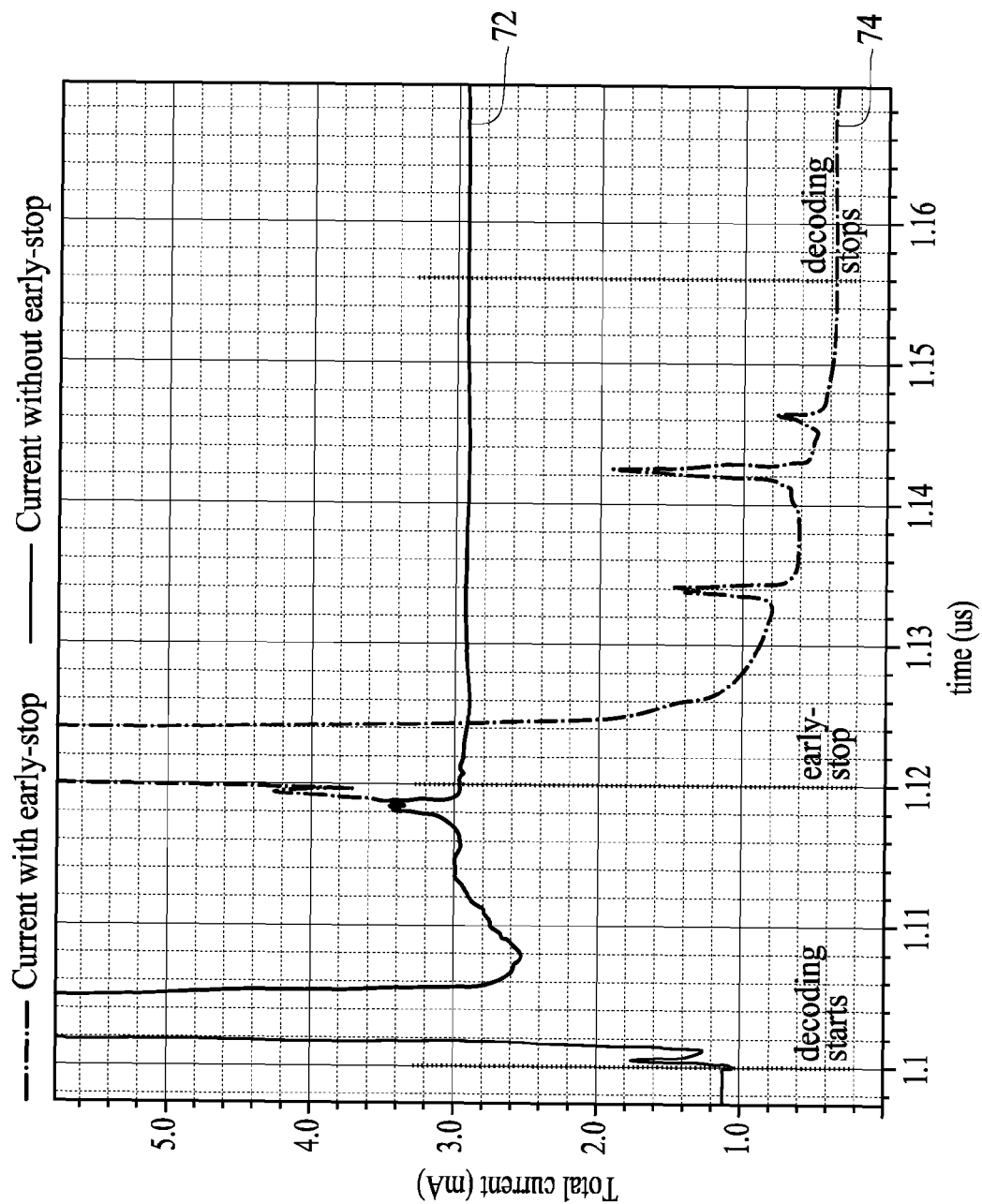
FIG. 9 shows the variation of currents during the decoding process for comparing the current levels with and without the early termination module.

FIG. 9 shows the variation of currents during the decoding process for comparing the current levels with and without early termination module. The current without an early terminating scheme is depicted in line 72, and the current with the early terminating scheme is depicted in line 74. It shows that in line 74 there is a significant drop in steady-state total current consumption after the early-stop signal. The peak current at the start of decoding is resulting from the switching current from the analog switches. After the early-stop signal, the analog switches are cut off, and hence there is another current peak. In cases with a longer codeword length, which is common in practical telecommunications, the decoding time may increase to longer than 100 ns, and the current peaks become negligible, while the steady-state current dominates the amount of power consumption. In FIG. 9, the amount of power saved is almost 50%. It can be seen that with the higher the maximum number of iterations chosen, the amount of power saving increases. This is especially true for larger codes, and this technique can be applied to any LDPC codes or detection systems in which iterative decoding is applicable.

Figure 10A:
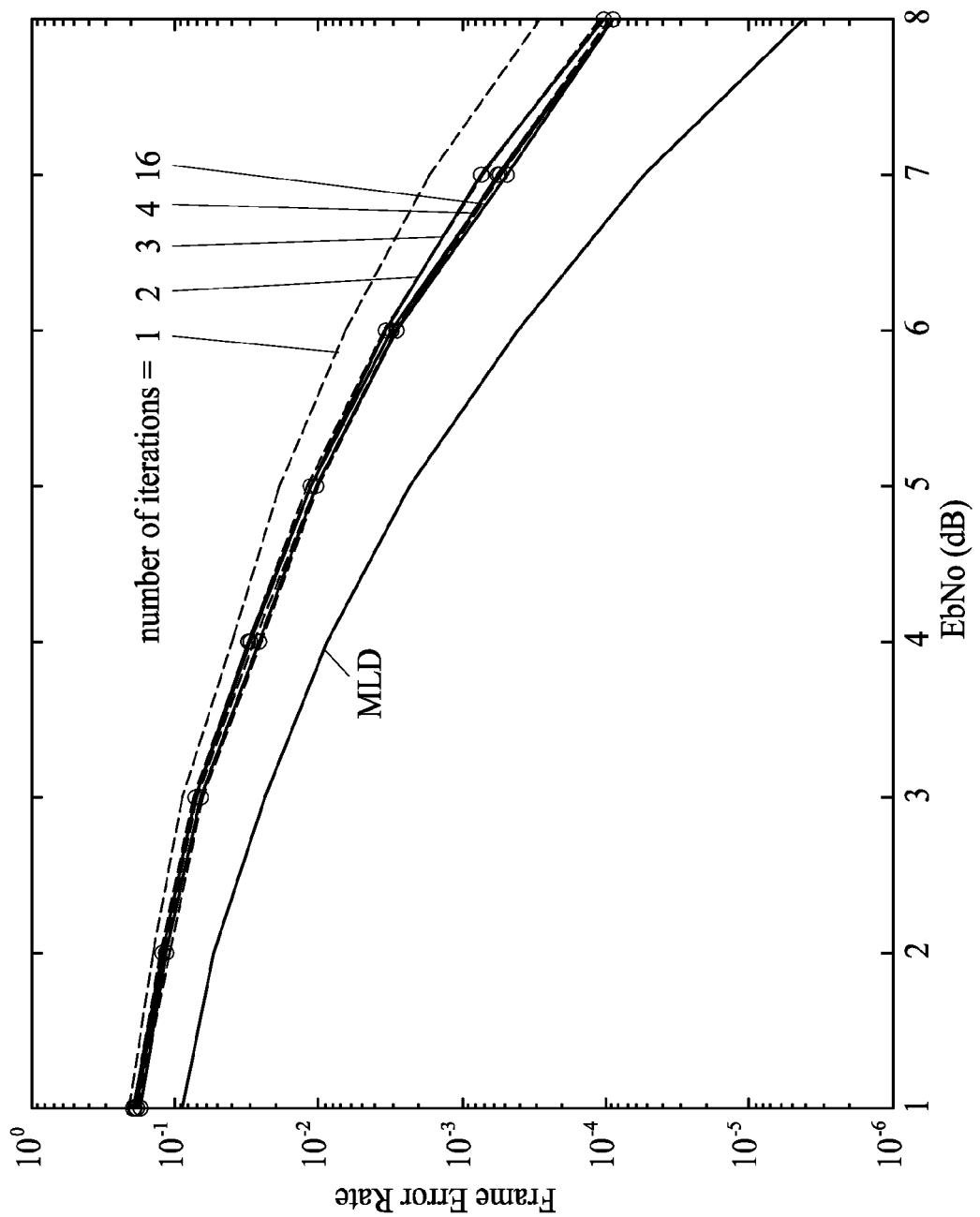
FIGS. 10A-10C illustrate power saving due to the use of asynchronous early-stopping scheme in accordance with aspects.
Figure 10B:
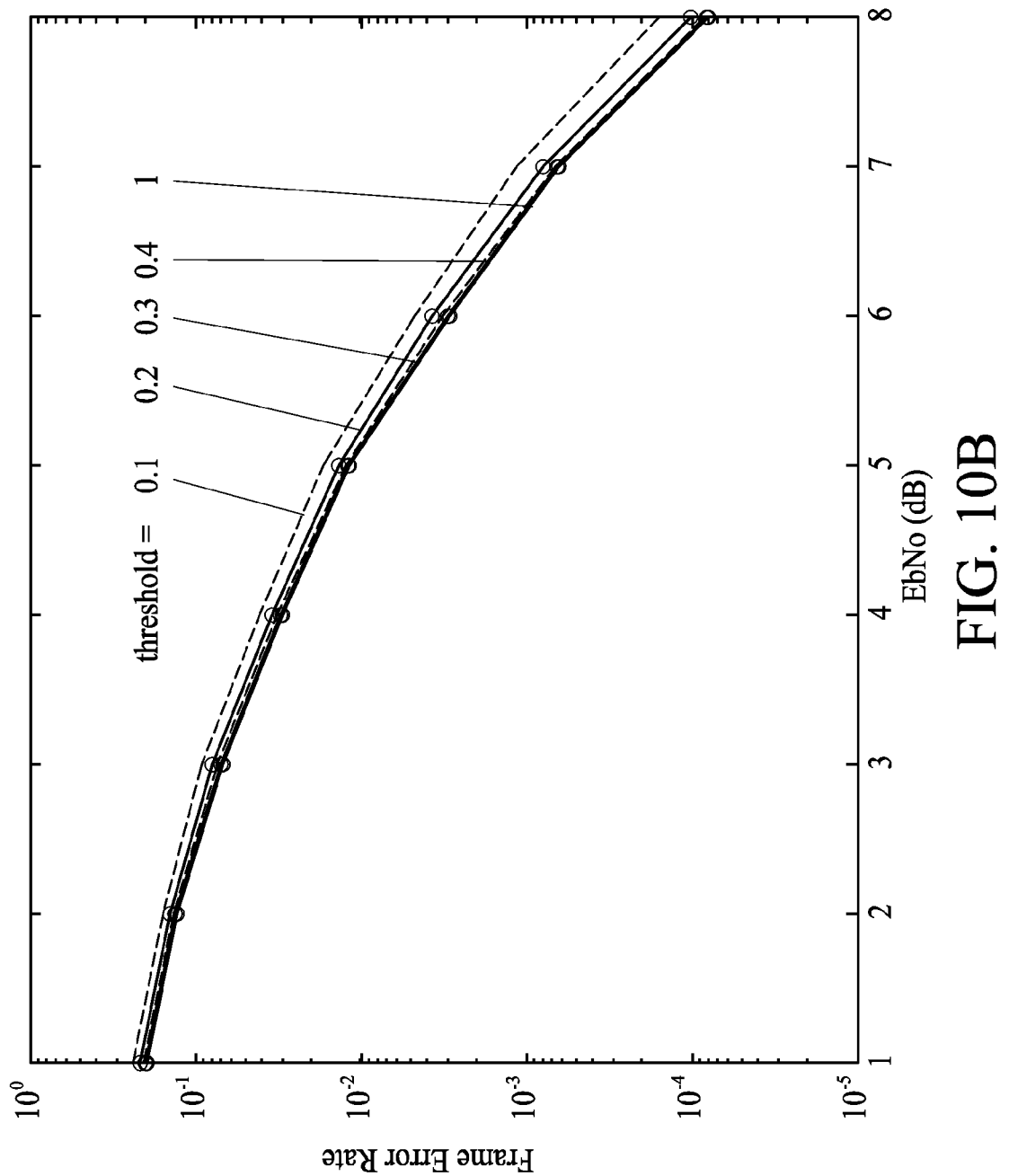
Figure 10C:
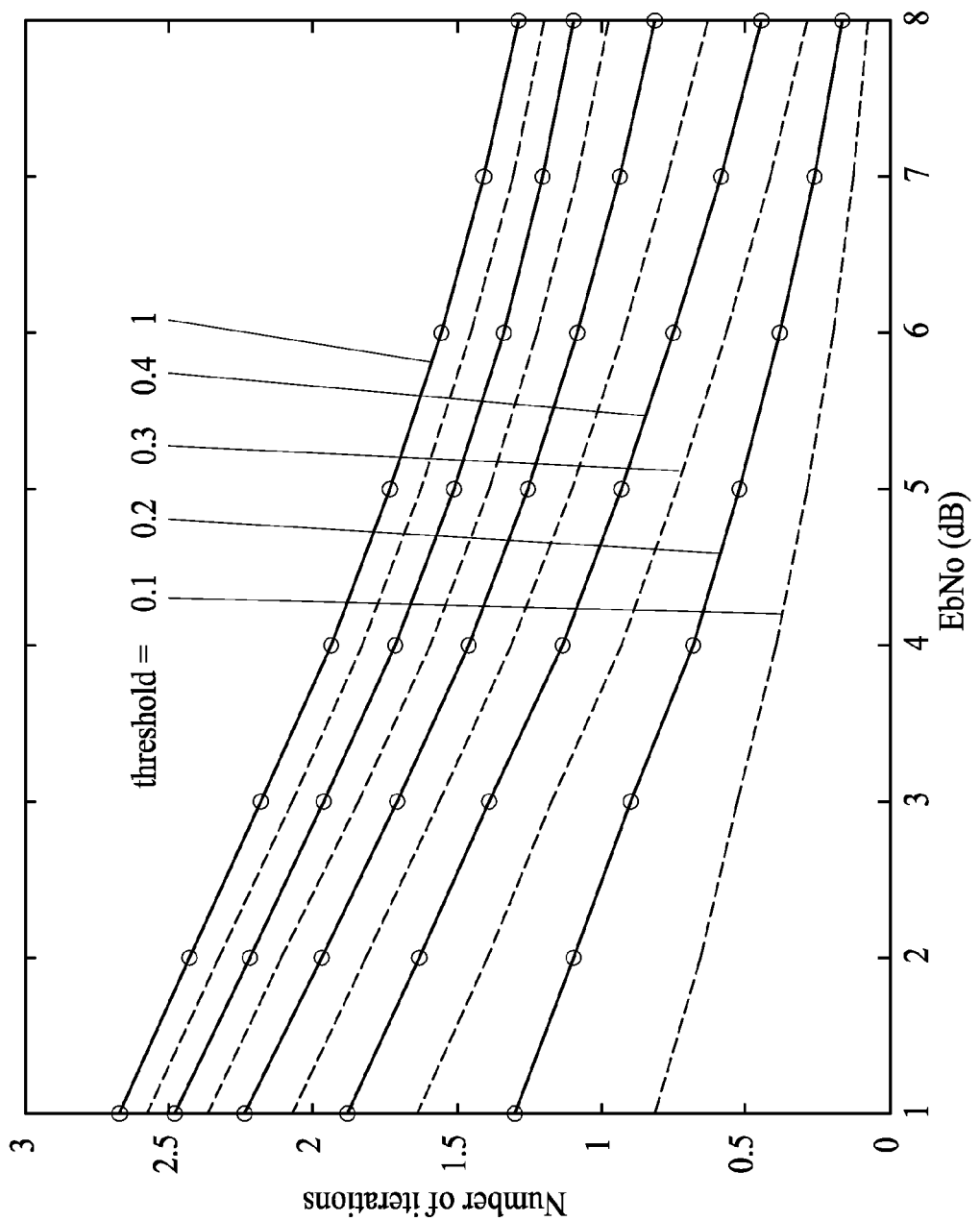

Power saving due to the use of asynchronous early-stopping scheme can be demonstrated in FIG. 10A-10C. A LDPC code using (8, 4) extended Hamming code is taken here as a simple illustrative example. In order to demonstrate the amount of power saving, discrete-time simulations are performed to decide the maximum number of min-sum iterations that is needed for the error performance to approach to that of a very large number (e.g. 50). The ideal performance using maximum-likelihood decoding (MLD) is the bottom curve. The curves from top to second bottom are for iterations 1 to 16. It can be seen that the smallest maximum number of iterations required for practical applications is 4. This number is in correspondence to the total decoding time required for continuous-time decoders.

FIG. 10B shows the error performance with 10 different threshold conditions with the selected maximum number of iterations. The curves from top to bottom are for threshold values 0.1, 0.2, 0.3 unto 1. On this maximum number of iterations, the performance of early-stopping scheme based on different threshold values is simulated. The optimal threshold value for this code is around 0.4, but a different threshold value may be more suitable for other codes.

FIG. 10C shows the number of iterations of the above threshold conditions. The curves from bottom to top are for threshold values 0.1, 0.2, 0.3 up to 1. The optimal threshold value for this code is around 0.4, but a different threshold value may be more suitable for other codes. The average number of iterations is about 1 for the threshold value 0.4.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising", as "comprising" is interpreted when employed as a transitional word in a claim.

What is claimed is:

1. A decoder, comprising:
   the coded bit stream;
   a serial-to-parallel sampler that receives, from a transconductance amplifier, an amplified current proportional to a voltage of a coded bit stream and converts the amplified current into a plurality of sampled currents and stores the plurality of sampled currents in a plurality of buffers;
   an analog min-sum decoder that receives the plurality of sampled currents from the plurality of buffers, wherein the plurality of sampled currents represent respective possibilities of a bit being 0 or 1, performs iterative decoding including iterative exchanges of the respective possibilities across a plurality of variable nodes and check nodes, and outputs a set of decoded codewords according to the respective possibilities; and
   an early terminating module that stops the iterative decoding in the analog min-sum decoder in response to convergence of the decoded codeword.

2. The decoder of claim 1, wherein the transconductance amplifier is a rail-to-rail transconductance amplifier with a range of an input or output voltage operating from a positive power supply to a negative power supply.

3. The decoder of claim 1, wherein the early terminating module stops the iterative decoding in the analog min-sum decoder in response to performance of a pre-determined number of iterations.

4. The decoder of claim 1, wherein the early terminating module stops the iterative decoding in the analog min-sum decoder in response to attainment of a pre-determined performance threshold.

5. The decoder of claim 1, wherein the early termination module is a cyclic redundancy check (CRC) control circuit module that stops the iterative decoding in the analog min-sum decoder in response to the decoded codeword having passed a CRC check.

6. The decoder of claim 1, wherein the analog min-sum decoder further comprises:
   a variable-node module that calculates a plurality of variable nodes messages $M_{v \to c}$ according to an equation $$M_{v \to c} = \sum_{i \in N(C) \backslash C} M_{i \to v} + M_v^{(0)}, \text{ wherein } M_v^{(0)}$$

is an initial input at a variable node v and $N(C)\backslash C$ represents a first set of neighboring nodes; and
   a check-node module that calculates a plurality of check nodes messages $M_{c \to v}$ according to an equation $$M_{c \to v} = \prod_{i \in N(C) \backslash V} \text{sgn}(M_{i \to c}) \cdot \min_{i \in N(C) \backslash v} |M_{i \to c}|,$$

where $N(C)\backslash V$ represents a second set of neighboring nodes, and sgn(.) returns 1 or $-1$ depending on a corresponding argument being non-negative or negative, respectively.

7. The decoder of claim 6, wherein the analog min-sum decoder further comprises an analog switch coupled with the variable-node module and the check-node module, and the analog switch terminates a connection between the variable-node module and the check-node module in response to the early termination module having signaled a stop sign.

8. The decoder of claim 7, wherein the analog min-sum decoder further comprises a 2:1 analog multiplexer that selects the initial input and a minimum current as inputs to the variable-node module, and in response to the early termination module having signaled the stop sign, the analog min-sum chooses the minimum current as the input to the variable-node module.

9. The decoder of claim 1, wherein the early termination module is an analog circuit.

10. The decoder of claim 6, wherein the check-node module further comprises:
    a real to absolute sign module that extracts signs and magnitudes of incoming messages received from other variable nodes that are connected to a check node;
    a set of minimum winner-take-all (WTA) modules that find respective minimum values among the magnitudes of the incoming messages from the other variable nodes;
    a set of sign multipliers that multiply respective signs of the incoming messages received from the other variable nodes; and
    a set of absolute value and sign to real converters that combine sign bits and absolute values and to generate outgoing messages as a function of the incoming messages.

11. The decoder of claim 9, wherein the set of sign multipliers are implemented with at least one XOR logic gate.

12. A method comprising:
    receiving, by a device including at least one processor from a transconductance amplifier, an amplified current proportional to a voltage of a coded bit stream;
    converting the amplified current into a plurality of sampled currents;
    storing the plurality of sampled currents in a plurality of buffers;
    iteratively exchanging a plurality of possibilities of bits to be 0 or 1 across a plurality of variable nodes and a plurality of check nodes, wherein the plurality of possibilities are represented as currents;
    outputting a set of decode codewords according to the plurality of possibilities; and
    stopping the iteratively exchanging in response to one of the decoded codewords converging.

13. The method of claim 12 further comprising, stopping the iteratively exchanging in response to reaching a pre-determined performance threshold.

14. The method of claim 12 further comprising, stopping the iteratively exchanging in response to a decoded codeword passing a cyclic redundancy check control check.

15. The method of claim 12, wherein the iteratively exchanging the plurality of possibilities further comprises:
determining a plurality of variable node messages $M_{v \to c}$ according to an equation $$M_{v \to c} = \sum_{i \in N(C) \backslash C} M_{i \to v} + M_v^{(0)}, \text{ wherein } M_v^{(0)}$$

is an initial input at a variable node v and $N(C)\backslash C$ represents a first set of neighboring nodes; and
determining a plurality of check node messages $M_{c \to v}$ according to an equation $$M_{c \to v} = \prod_{i \in N(C) \backslash V} \text{sgn}(M_{i \to c}) \cdot \min_{i \in N(C) \backslash v} |M_{i \to c}|,$$

where $N(C)\backslash V$ represents a second set of neighboring nodes, and sgn(.) returns 1 or −1 based at least in part upon an argument of sgn(.) being non-negative or negative, respectively.

16. A system comprising:
means for receiving an amplified current proportional to a voltage of a coded bit stream from a transconductance amplifier;
means for converting the amplified current into a plurality of sampled currents;
means for iteratively exchanging a plurality of possibilities of bits across a plurality of variable nodes and a plurality of check nodes, wherein the plurality of possibilities are represented as a plurality of currents;
means for outputting a set of decoded codewords according to the plurality of possibilities; and
means for ceasing operation of the means for iteratively exchanging in response to one of the decoded codewords converging.

17. The system of claim 16 further comprising:
means for ending operation of the means for iteratively exchanging in response to attaining a pre-determined performance threshold.

18. The system of claim 16 further comprising, means for ending operation of the means for iteratively exchanging in response to a decoded codeword passing a cyclic redundancy check control check.

19. The system of claim 16, wherein the means for iteratively exchanging the plurality of possibilities further comprises:
means for calculating a plurality of variable node messages $M_{v \to c}$ according to an equation $$M_{v \to c} = \sum_{i \in N(C) \backslash C} M_{i \to v} + M_v^{(0)}, \text{ wherein } M_v^{(0)}$$

is an initial input at a variable node v and $N(C)\backslash C$ represents a first set of neighboring nodes; and
means for calculating a plurality of check nodes messages $M_{c \to v}$ according to an equation $$M_{c \to v} = \prod_{i \in N(C) \backslash V} \text{sgn}(M_{i \to c}) \cdot \min_{i \in N(C) \backslash v} |M_{i \to c}|,$$

where $N(C)\backslash V$ represents a second set of neighboring nodes, and sgn(.) returns 1 or −1 based at least in part upon an argument of sgn(.) being non-negative or negative, respectively.

20. The system of claim 16, further comprising:
means for storing the plurality of sampled currents in a plurality of buffers.

21. A non-transitory computer-readable storage medium comprising computer-readable instructions that, in response to execution, cause a computing system including at least one processor to perform operations, comprising:
receiving an amplified current proportional to a voltage of a coded bit stream from a transconductance amplifier;
converting the amplified current into a plurality of sampled currents;
storing the plurality of sampled currents in a plurality of buffers;
iteratively exchanging a plurality of possibilities of bits to be 0 or 1 across a plurality of variable nodes and a plurality of check nodes, wherein the plurality of possibilities are represented as currents;
outputting a set of decode codewords according to the plurality of possibilities; and
stopping the iteratively exchanging in response to one of the decoded codewords converging.

22. The computer-readable storage medium of claim 21, the operations further comprising:
stopping the iteratively exchanging in response to reaching a pre-determined performance threshold.

23. The computer-readable storage medium of claim 21, the operations further comprising:
stopping the iteratively exchanging in response to a decoded codeword passing a cyclic redundancy check control check.

24. The computer-readable storage medium of claim 21, wherein the iteratively exchanging the plurality of possibilities further comprises:
determining a plurality of variable node messages $M_{v \to c}$ according to an equation $$M_{v \to c} = \sum_{i \in N(C) \backslash C} M_{i \to v} + M_v^{(0)}, \text{ wherein } M_v^{(0)}$$

is an initial input at a variable node v and $N(C)\backslash C$ represents a first set of neighboring nodes; and
determining a plurality of check node messages $M_{c \to v}$ according to an equation $$M_{c \to v} = \prod_{i \in N(C) \backslash V} \text{sgn}(M_{i \to c}) \cdot \min_{i \in N(C) \backslash v} |M_{i \to c}|,$$

where $N(C)\backslash V$ represents a second set of neighboring nodes, and sgn(.) returns 1 or −1 based at least in part upon an argument of sgn(.) being non-negative or negative, respectively.

* * * * *

UNITED STATES PATENT AND TRADEMARK OFFICE
CERTIFICATE OF CORRECTION

PATENT NO. : 8,291,298 B2
APPLICATION NO. : 12/431917
DATED : October 16, 2012
INVENTOR(S) : Lo et al.

Page 1 of 2

It is certified that error appears in the above-identified patent and that said Letters Patent is hereby corrected as shown below:

On the Title Page, in Item [56], under "OTHER PUBLICATIONS", in Column 1, Line 2, delete "publication).*" and insert -- publication.* --, therefor.

On the Title Page, in Item [56], under "OTHER PUBLICATIONS", in Column 1, Line 4, delete "publication).*" and insert -- publication.* --, therefor.

On the Title Page, in the Figure, delete " 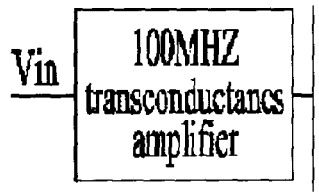 " and insert -- 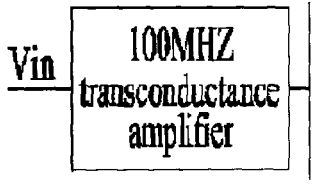 --, therefor.

In the Drawings:

In Fig. 6, Sheet 6 of 15, delete " 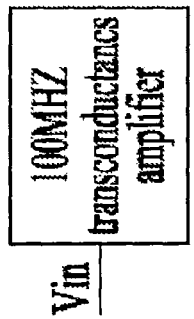 " and insert -- 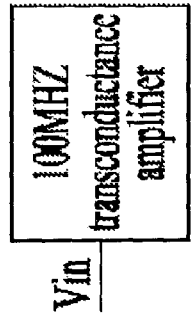 --, therefor.

Signed and Sealed this
Twentieth Day of August, 2013

Teresa Stanek Rea
*Acting Director of the United States Patent and Trademark Office*

CERTIFICATE OF CORRECTION (continued)
U.S. Pat. No. 8,291,298 B2

In the Specifications:

In Column 2, Line 67, delete "circuit." and insert -- circuit; --, therefor.

In Column 3, Line 4, delete "decoder; and" and insert -- decoder; --, therefor.

In Column 3, Line 7, delete "module." and insert -- module; and --, therefor.

In Column 4, Lines 55-63, delete "
$$\begin{cases} m_{c1 \to v7} = \text{sgn}(m_{v11 \to c1}) \times \text{sgn}(m_{v12 \to c1}) \times \text{sgn}(m_{v19 \to c1}) \times \\ \quad \min(|m_{v11 \to c1}, m_{v12 \to c1}|, m_{v19 \to c1}|) \\ m_{c1 \to v11} = \text{sgn}(m_{v7 \to c1}) \times \text{sgn}(m_{v12 \to c1}) \times \text{sgn}(m_{v19 \to c1}) \times \\ \quad \min(|m_{v7 \to c1}, m_{v12 \to c1}|, m_{v19 \to c1}|) \\ m_{c1 \to v12} = \text{sgn}(m_{v11 \to c1}) \times \text{sgn}(m_{v7 \to c1}) \times \text{sgn}(m_{v19 \to c1}) \times \\ \quad \min(|m_{v11 \to c1}, m_{v7 \to c1}|, m_{v19 \to c1}|) \\ m_{c1 \to v19} = \text{sgn}(m_{v11 \to c1}) \times \text{sgn}(m_{v12 \to c1}) \times \text{sgn}(m_{v7 \to c1}) \times \\ \quad \min(|m_{v11 \to c1}, m_{v12 \to c1}|, m_{v7 \to c1}|) \end{cases}$$
"
and insert --
$$\begin{cases} m_{c1 \to v7} = \text{sgn}(m_{v11 \to c1}) \times \text{sgn}(m_{v12 \to c1}) \times \text{sgn}(m_{v19 \to c1}) \times \\ \quad \min(|m_{v11 \to c1}, m_{v12 \to c1}|,|m_{v19 \to c1}|) \\ m_{c1 \to v11} = \text{sgn}(m_{v7 \to c1}) \times \text{sgn}(m_{v12 \to c1}) \times \text{sgn}(m_{v19 \to c1}) \times \\ \quad \min(|m_{v7 \to c1}, m_{v12 \to c1}|,|m_{v19 \to c1}|) \\ m_{c1 \to v12} = \text{sgn}(m_{v11 \to c1}) \times \text{sgn}(m_{v7 \to c1}) \times \text{sgn}(m_{v19 \to c1}) \times \\ \quad \min(|m_{v11 \to c1}, m_{v7 \to c1}|,|m_{v19 \to c1}|) \\ m_{c1 \to v19} = \text{sgn}(m_{v11 \to c1}) \times \text{sgn}(m_{v12 \to c1}) \times \text{sgn}(m_{v7 \to c1}) \times \\ \quad \min(|m_{v11 \to c1}, m_{v12 \to c1}|,|m_{v7 \to c1}|) \end{cases}$$
--, therefor.

In Column 5, Line 40, delete "100 fF" and insert -- 100 pF --, therefor.

In Column 5, Line 43, delete "serious" and insert -- series --, therefor.

In Column 5, Line 44, delete "sample-" and insert -- sample --, therefor.

In Column 6, Line 10, delete "minor" and insert -- mirror --, therefor.

In the Claims:

In Column 7, Line 29, in Claim 1, delete "the coded bit stream;".